(12) United States Patent
Pagani

(10) Patent No.: US 10,186,463 B2
(45) Date of Patent: *Jan. 22, 2019

(54) METHOD OF FILLING PROBE INDENTATIONS IN CONTACT PADS

(71) Applicant: STMicroelectronics S.r.l., Agrate Brianza (IT)

(72) Inventor: Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 63 days.

This patent is subject to a terminal disclaimer.

(21) Appl. No.: 15/005,178

(22) Filed: Jan. 25, 2016

(65) Prior Publication Data

US 2016/0141216 A1 May 19, 2016

Related U.S. Application Data

(62) Division of application No. 13/106,557, filed on May 12, 2011, now Pat. No. 9,275,962.

(30) Foreign Application Priority Data

May 12, 2010 (IT) .............................. MI2010A0843

(51) Int. Cl.
*H01L 21/66* (2006.01)
*H01L 23/00* (2006.01)
(Continued)

(52) U.S. Cl.
CPC .......... *H01L 22/32* (2013.01); *G01R 31/2886* (2013.01); *H01L 21/76877* (2013.01);
(Continued)

(58) Field of Classification Search
CPC ............... H01L 22/32; H01L 21/76877; H01L 23/53242; H01L 23/53257; H01L 23/528;
(Continued)

(56) References Cited

U.S. PATENT DOCUMENTS 5,391,516 A * 2/1995 Wojnarowski .... H01L 21/76877
257/E21.585
6,274,935 B2 8/2001 Uzoh
(Continued)

FOREIGN PATENT DOCUMENTS

| JP | 2007214363 A | 8/2007 |
| JP | 2008235314 A | 10/2008 |

OTHER PUBLICATIONS

Italian Search Report for MI2010A000843 dated Dec. 28, 2010 (2 pages).
(Continued)

*Primary Examiner* — John P. Dulka
(74) *Attorney, Agent, or Firm* — Crowe & Dunlevy

(57) ABSTRACT

An integrated electronic circuit has probe indentations filled by a hard covering substance. The integrated circuit device results from a process of manufacturing including forming a substrate comprising a plurality of functional components of the electronic circuit, creating a plurality of conductive layers on such substrate to form an electric contact region with high hardness equal to or greater than a first hardness value of about 300 HV, contacting the electric contact region with a probe thereby causing an indentation. The process further comprises, after the test run, creating a covering conductive layer on at least one part of the electric contact region contacted by the probe to fill the indentation.

26 Claims, 2 Drawing Sheets

(51) Int. Cl.
*G01R 31/28* (2006.01)
*H01L 21/768* (2006.01)
*H01L 23/528* (2006.01)
*H01L 23/532* (2006.01)

(52) U.S. Cl.
CPC ...... *H01L 23/528* (2013.01); *H01L 23/53209* (2013.01); *H01L 23/53242* (2013.01); *H01L 23/53257* (2013.01); *H01L 24/05* (2013.01); *H01L 24/92* (2013.01); H01L 2224/04042 (2013.01); H01L 2224/05082 (2013.01); H01L 2224/05144 (2013.01); H01L 2224/05155 (2013.01); H01L 2224/05157 (2013.01); H01L 2224/05164 (2013.01); H01L 2224/05173 (2013.01); H01L 2224/05557 (2013.01); H01L 2224/05644 (2013.01); H01L 2224/05664 (2013.01); H01L 2224/48463 (2013.01); H01L 2924/014 (2013.01); H01L 2924/01013 (2013.01); H01L 2924/01027 (2013.01); H01L 2924/01029 (2013.01); H01L 2924/01033 (2013.01); H01L 2924/01045 (2013.01); H01L 2924/01046 (2013.01); H01L 2924/01079 (2013.01); H01L 2924/14 (2013.01); H01L 2924/1461 (2013.01); H01L 2924/19041 (2013.01)

(58) Field of Classification Search
CPC ... H01L 23/53209; H01L 24/92; H01L 24/05; G01R 31/2886
See application file for complete search history.

(56) References Cited

U.S. PATENT DOCUMENTS

| | | | |
|---|---|---|---|
| 6,339,257 B1 | 1/2002 | Fujiki et al. | |
| 6,734,036 B2 | 5/2004 | Chakrabarti et al. | |
| 6,747,355 B2 | 6/2004 | Abiru et al. | |
| 7,105,379 B2 | 9/2006 | Tsao et al. | |
| 7,470,612 B2 | 12/2008 | Choi et al. | |
| 7,550,844 B2 | 6/2009 | Matsuki et al. | |
| 8,324,622 B2 | 12/2012 | Zhang et al. | |
| 2001/0000416 A1 | 4/2001 | Uzoh | |
| 2001/0046715 A1 | 11/2001 | Takemoto et al. | |
| 2003/0107137 A1* | 6/2003 | Stierman | B81B 7/0006 257/763 |
| 2005/0073057 A1 | 4/2005 | Tiziani et al. | |
| 2005/0208684 A1 | 9/2005 | Yamada et al. | |
| 2007/0228561 A1 | 10/2007 | Matsuki et al. | |
| 2008/0037667 A1 | 2/2008 | Visalli et al. | |
| 2008/0083923 A1 | 4/2008 | Nakauchi | |
| 2008/0143454 A1 | 6/2008 | McCorquodale et al. | |
| 2008/0237854 A1 | 10/2008 | Wu et al. | |
| 2009/0243038 A1* | 10/2009 | Nagai | H01L 24/03 257/532 |
| 2011/0089962 A1 | 4/2011 | Pagani | |

OTHER PUBLICATIONS

Manika, et al: "Effect of Substrate Hardness and Film Structure on Indentation Depth Criteria for Film Hardness Testing," Journal of Physics D; Applied Physics, 20080407 Institute of Physics Publishing Ltd., GB—ISSN 0022-3727, Vo. 41, No. 7 (6 pages).

E-384-06 Standard Test Method for Microindentation Hardness of Materials, ASTM International Standard, 20070101 ASTM International, US, vol. 384, pp. 487-518, XP009142601.

Sauter, Wolfgang et al: "Problems with Wirebonding on Probe Marks and Possible Solutions," 2003 Electronic Components and Technology Conference, 2003 IEEE, pp. 1350-1358.

* cited by examiner

METHOD OF FILLING PROBE INDENTATIONS IN CONTACT PADS

CROSS REFERENCE TO RELATED APPLICATION

This application is a divisional application from U.S. patent application Ser. No. 13/106,557 filed May 12, 2011, now U.S. Pat. No. 9,275,962 issued on Mar. 1, 2016, which claims priority from Italian Application for Patent No. MI2010A000843 filed May 12, 2010, the disclosures of which are hereby incorporated by reference.

TECHNICAL FIELD

An embodiment generally relates to the electronic field. More specifically, an embodiment relates to the test of integrated electronic circuits.

BACKGROUND

Electronic circuits are generally tested to verify their proper operation; this is often of the utmost importance to ensure a high quality of the production process of the electronic circuits. Tests may be performed on each electronic circuit at different levels of the corresponding production process: for example, a test process called EWS (Electrical Wafer Sort) is performed on the electronic circuits included in a corresponding wafer of semiconductor material, before the individual portions of the wafer on which there are integrated the electronic circuits are diced into individual chips and embedded in respective packages. Such test includes measurements performed on each electronic circuit by automatic test equipment, known as ATE. Such test apparatus is provided with a probe card, which substantially includes a printed circuit board comprising a plurality (typically, hundreds, or even thousands) of probes of conductive material for contacting corresponding conductive pads of the electronic circuits to be tested. During the test, the probe card is positioned in correspondence of a group of electronic circuits of the wafer so that the probes mechanically contact their pads (operation that in jargon is defined as probing); this provides an electrical connection between the test apparatus and the pads of such electronic circuits, which allows the test thereof. The same operations are repeated in succession on each group of electronic circuits of the wafer until all the electronic circuits formed therein have been tested.

In order to ensure that a proper probing procedure has been performed between each probe and the corresponding pad, typically before or after the test, a (manual or automatic) checking operation is carried out which consists of detecting and analyzing a probe mark left by the probe on the pad during the probing operation.

Being able to detect the presence and the arrangement of the probe marks allows first determining the correct alignment and centering between the probes of the probe card on the pads of the electronic circuits under test; in this way, it is possible to reconfigure the parameters of the probing so as to reduce the risk of damage of a passivation layer around the pad caused by a not totally accurate probing. Moreover, such risk is, in modern applications, very considerable, since the number of pads within a same electronic circuit is higher and higher, while their sizes and their relative separation distances are smaller and smaller.

Moreover, the analysis of the probe mark allows determining a correct and uniform pressure exerted by the probes of the probe card on the pads of the electronic circuits, so as to be able to act on the parameters of the probing in order to have a low and uniform contact resistance during the test.

However, in recent applications, the test EWS has drawbacks connected to the impracticality to impossibility of being able to perform such checking operation.

In fact, because of growing demands, especially in automotive applications, of electronic circuits capable of operating in adverse conditions (e.g., high temperatures), the pads (and the corresponding electric connections between the pads and respective terminals of the package) of such electronic circuits are more and more frequently formed by different materials with respect to those traditionally used (such as copper and aluminium). For example, US patent application No. US 2005/0073057, which is incorporated by reference, proposes a multi-layer pad structure having a high hardness property; such property is achieved by using a conductive material with high hardness (e.g., nickel or alloys thereof), possibly covered by a thin protective layer of conductive material that is relatively soft (e.g., palladium or alloys thereof).

The greater hardness of such pads with respect to the materials traditionally used for making the probes results, during the probing, in that the pad is not scratched by the respective probe; in this way, the probe mark is difficult to detect to undetectable, so that it turns out to be very difficult, if not practically impossible, to perform the checking operation of the probing. This involves a difficulty to substantial impossibility to act on parameters of the probing, with consequent increase during the test of the cases of breakage of the passivation layer, and loss of electric yield (due to a high and heterogeneous contact resistance between each probe of the probe card and the corresponding pad), which imply possible false test failures, and correspondingly a reduction in the process yield with consequent increase of the production costs of the electronic circuits.

At the same time, the difficulty/impossibility of leaving the probe mark may be due in part to the mechanical properties of the specific type of probe used for testing. In this regard, various types of probes are commercially available, such as cantilever, MEMS and vertical probes, but their use does not provide satisfactory results in certain situations, making them in practice not always effectively usable.

Typically during the probing it may happen that such probes cause an excessively deep probe mark on the pad such to uncover some layers thereof that, once exposed to the external environment, may be subject to chemical and/or physical changes. This happens for example in the case of nickel, which oxidizes if the palladium protective conductive layer formed thereon is removed, and of copper, which oxidizes if the aluminium protective conductive layer formed thereon is removed. For example, in the case of nickel, the removal of palladium may occur after the use of probes that have a high hardness or after repeated probing actions of the probe on the pad.

In addition, an excessively deep probe mark on the pad typically causes a loss of yield during the assembly operations that connect, for example by welding of wire bonding, the pad of the electronic circuit and the terminals of the corresponding package, as in such situation the welding is not effective; in particular, the effectiveness of the welding is compromised both for geometrical reasons (a highly non-planar surface, such as that obtained in response to an excessively deep probe mark, may not allow a good adhesion), and for reasons of lack of compatibility of the materials involved in the welding (e.g., nickel generally has poor adhesion properties with different materials).

SUMMARY

In view of the state of the art herein shown, an embodiment overcomes the above-mentioned drawbacks.

More specifically, an embodiment is a manufacturing process for an integrated electronic circuit; the process comprises forming a substrate comprising a plurality of functional components of the electronic circuit, creating a plurality of conductive layers on such substrate to form an electric contact region with high hardness equal to or greater than a first hardness value of about 300 HV, contacting the electric contact region with a probe and running an electric test of the electronic circuit. In an embodiment, the process further comprises, after the test run, creating a covering conductive layer on at least one part of the electric contact region contacted by the probe.

Another embodiment relates to a corresponding electronic circuit.

Thanks to an embodiment, even in particular applications, such as the automotive applications, for which it may be necessary to produce electronic circuits having materials that make the pads very hard, it may be possible to produce electronic circuits with high electrical, physical and mechanical properties despite performing the testing thereof through probes having high hardness. In this way, it may be possible to detect and analyze the probe mark indicating that the contact between the probe and the pad occurred during the running of the test, which allows using the same techniques of checking and analysis of the probe mark that are used downstream the test of conventional electronic circuits (i.e., having traditional pads) performed using conventional probes. Therefore, an embodiment implies a considerable reduction of the production costs, since the yield losses resulting from damages of the circuits or unreliable test results may be reduced at the minimum, which are caused, in turn, by the difficulty/impossibility of controlling the probe mark in order to act accordingly on the parameters of the probing process.

BRIEF DESCRIPTION OF THE DRAWINGS

Features and advantages of an embodiment will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this respect, it is expressly understood that the figures are not necessarily drawn to scale and that, unless otherwise indicated, they are simply used to conceptually illustrate the described structures and procedures. In particular.

DETAILED DESCRIPTION

Figure 1A:
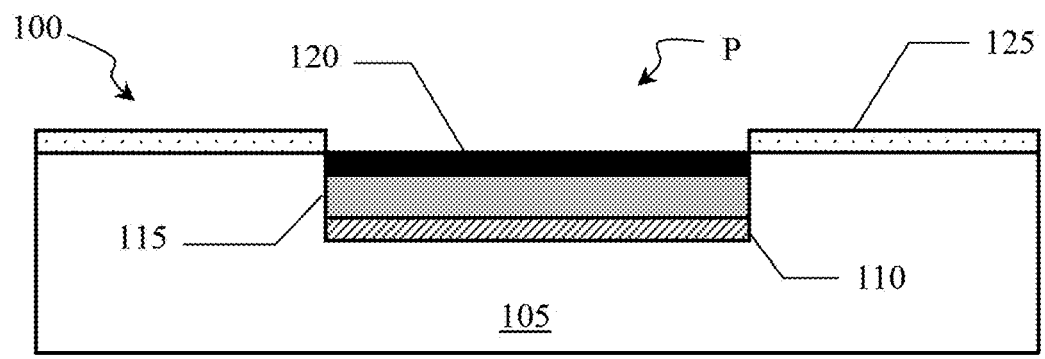
FIGS. 1A-1C show some phases of a manufacturing or production process of an electronic circuit according to an embodiment.
Figure 1B:
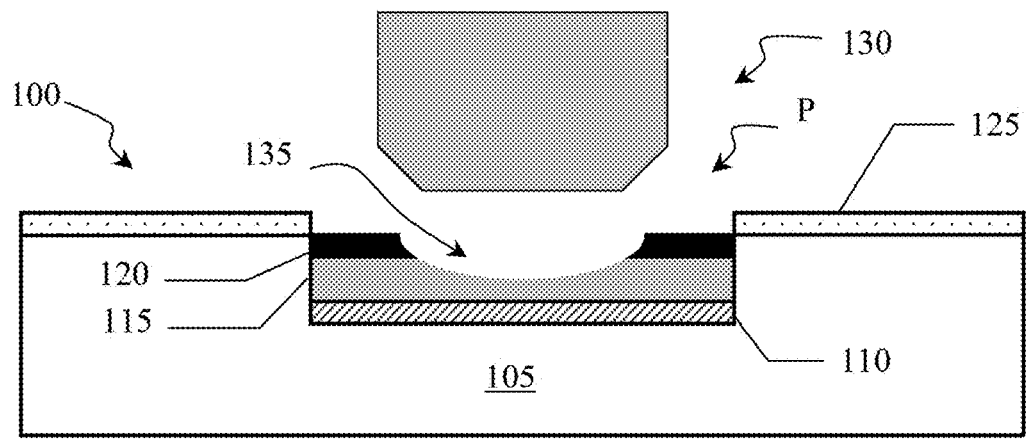
Figure 1C:
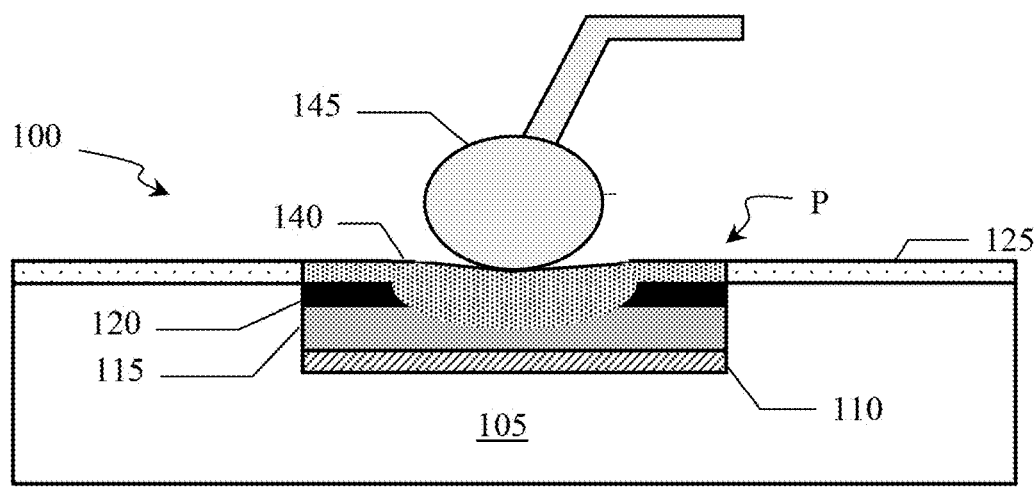

With reference to FIGS. 1A-1C, they show, according to an embodiment, some salient phases of a production process of electronic circuits, such phases including the functional and/or parametric electric test (or simply electric test, or test). In general, the production process is performed at the level of a wafer of semiconductor material in which identical electronic circuits are made concurrently in large number and separated at the end through a cutting operation; for the sake of description simplicity, however, in the following reference will be made to only one of such electronic circuits, indicated by the number reference 100.

In particular, in FIG. 1A there is shown a part of the electronic circuit 100 at a final phase of its production process, before the electrical test and the assembly operation for encapsulating the electronic circuit 100 within the corresponding package. The electronic circuit 100 includes a substrate 105 in which there are formed, through, for example, any known process, functional components implementing specific functions of the electronic circuit 100. Such functional components, which may include active components (such as transistors) and/or passive components (such as resistors, capacitors, and inductors) are typically formed such as to occupy different functional parts of the volume of the electronic circuit, with each functional part that is electrically coupled to the other functional parts coupled through corresponding metal conductive layers, for example of copper or aluminium, and layers of conductive vias that are placed on or included between such functional parts.

A portion of a last metal layer defines a conductive contact 110, above which a conductive layer 115 and a thin surface conductive layer 120 may be created through known techniques (e.g., electrodeless or electrolytic or deposition processes).

The conductive layer 115 is formed, in the exemplary described embodiment, of a material having high hardness, for example nickel, which is used for coating, by protecting, the conductive contact 110 and thus the functional substrate 105 of the electronic circuit 100. For example, the thickness of the conductive layer 115 may typically have a value of some μm (from approximately 1 up to approximately 20 μm) in order to ensure adequate protection of the conductive contact 110 (and of the functional components below) and preserve it from malfunctions in case that the electronic circuit 100 is used in environments with high temperature (such as in automotive applications).

The surface conductive layer 120 is instead made of a conductive material suitable to effectively coat the conductive layer 115, so as not to expose it to direct contact with the surrounding environment; in this way, it may be possible to prevent oxidation phenomena (or, in general, chemical and/or physical changes) of the conductive layer 115 if the latter has properties that cause its oxidation in contact with the air, as it may happen in the case herein considered of conductive layer 115 made of nickel.

In the exemplary described embodiment, the conductive layer 120 is of palladium, which has a lower hardness than that of nickel, and may have a thickness of approximately between 2% and 75%, for example, approximately between 2% and 15%, such as approximately 10% of the thickness of the conductive layer 115 of nickel below it.

The structure thereby obtained, formed by the conductive contact 110 and by the conductive layers 115 and 120 on it, defines a pad P that is to be contacted for testing the electronic circuit 100 and for electrically coupling, in the following assembly phase, the electronic circuit 100 to the terminals of the respective package.

In the particular described scenario, the obtained pad P has a hardness totally greater than that of a traditional pad. For example, a traditional pad is typically formed by a conductive copper layer (usually by a portion of the last metal layer of the electronic circuit 100) and by a conductive aluminium layer placed on it (or their alloys), and such materials may have hardness values between approximately 10 HV and 150 HV (according to the Vickers scale) depending on the relative thickness of the conductive layers forming the pad. In the described pad P, instead, the conductive layer 115 in nickel, created for example by using an electrodeless process, may have hardness values between approximately 350 HV and 750 HV (and up to approximately 1100 HV after specific thermal treatments); please note that, although palladium, from which the conductive layer 120 is formed, has, as known, a lower hardness than that of nickel, the smaller thickness of the conductive layer 120 with respect to the below conductive layer 115 results in that the total hardness value of the pad P is given with a good approximation by the hardness value of the conductive layer 115.

Exposed portions of the functional substrate 105 of the electronic circuit 100 are coated with a passivation layer 125 for protecting them from contamination/corrosion by weathering or unwanted chemical reactions at their interface.

As schematized in FIG. 1B, in order to perform the probing of the pad P of the electronic circuit 100, a conductive probe 130 is used in which at least an end portion thereof has on the whole a high hardness (e.g., with hardness values, in first approximation, approximately between 300 and 1500 HV or even higher); the conductive probe 130, only the end portion of which that is intended to contact the pad P is schematically shown in such figure, may be for example a cantilever, MEMS, or vertical probe.

In FIG. 1B there is shown the effect of the action of the probe 130 on the pad P: the resulting probe mark, indicated by the reference 135, is represented schematically by a hollow extending from the outer surface of the pad P (i.e., from the thin conductive layer 120) to part of the conductive layer 115 below.

As shown in FIG. 1C, once the electric test of the electronic circuit 100 is performed, a coating conductive layer 140 is placed on the surface conductive layer 120 and on the probe mark 135. Such coating layer 140, which may be for example of palladium, gold or alloys thereof with the possible addition of other materials, substantially plays a dual function: firstly, it prevents oxidation phenomena of the portion of the nickel conductive layer 115 that, because of the incision depth of the probe mark, turns out to be exposed to the action of atmospheric agents. Furthermore, it facilitates a welding process between the pad P and conductive means on it; in fact, having the probe 130 a high hardness, the depth of the probe mark 135 may be relevant, and therefore the conductive means would have to be welded to a non-planar shape. This might result in a loss of electric continuity between the pad P and the conductive means; the presence of the coating conductive layer 140, instead, reduces, or even cancels, the depth of the probe mark 135, thus possibly ensuring a greater grip of the conductive means welded thereon. Such connection is shown exemplarily, but not limitatively, in the case that such contact includes a wirebond 145, made above the coating layer 140; such wire bond 145 is used for electrically contacting the pad P (and thus the electronic circuit 100) to the terminals of the package in which the electronic circuit 100 is encapsulated in the subsequent assembly process (not shown in any figure).

Figure 2A:
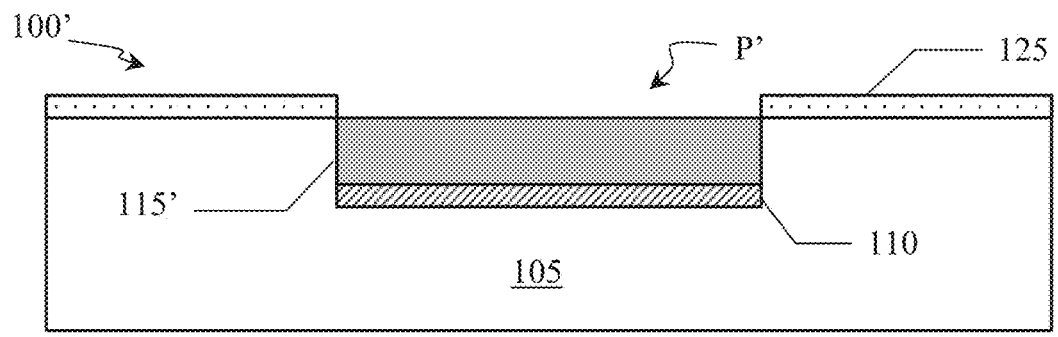
FIGS. 2A-2C show some phases of a production process of an electronic circuit according to another embodiment invention.
Figure 2B:
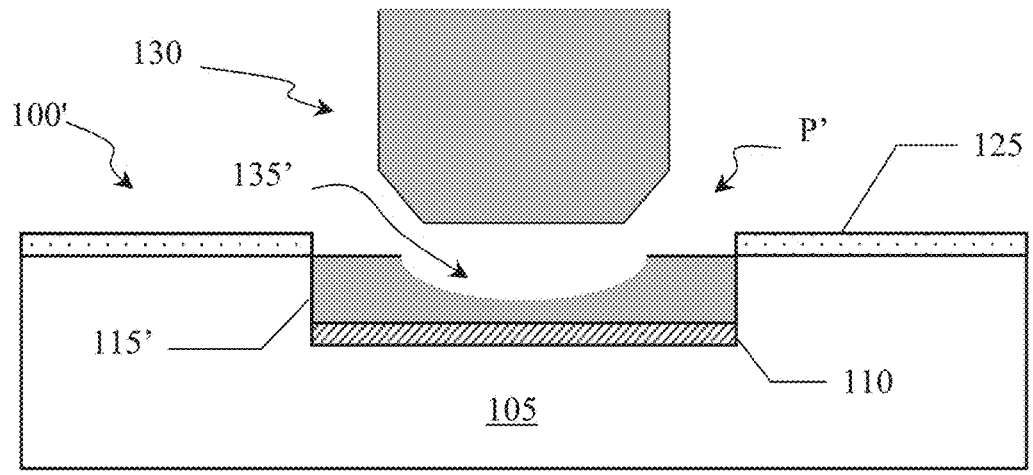
Figure 2C:
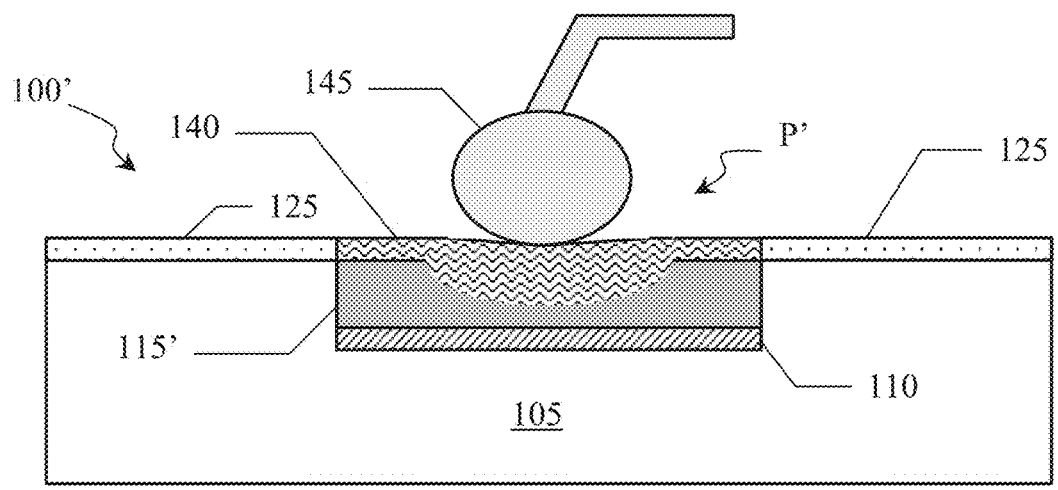

FIGS. 2A-2C show a production process of an electronic circuit 100' according to another embodiment. As shown in FIG. 2A, the electronic circuit 100' is substantially structurally identical to the electronic circuit 100, with a difference that the thin conductive layer 120 is no longer provided. In fact, the electronic circuit 100' includes a conductive layer 115' having both a high hardness and such properties that it typically cannot be oxidized and/or altered by the aggression of atmospheric agents (at least during the whole period of the production process). For example, such conductive layer 115' may be of rhodium, cobalt and/or alloys thereof with the addition of other materials (such as palladium in proper quantities). The conductive layers 110 and 115' form the corresponding pad P' of the electronic circuit 100'.

Analogously to that previously described, in FIG. 2B the probing of the probe 130 on the pad P' is carried out for performing the electric test of the electronic circuit 100', after which the probe 130 is removed from the pad P' and a probe mark 135' (extending within a portion of the conductive layer 115') is then visible.

As schematized in FIG. 2C, then a coating layer 140 is placed on the conductive layer 115' and on the probe mark 135', by using known techniques; in this way, the subsequent welding process of the wirebond 145 may be improved, as described above.

The described embodiments allow using, even in electronic circuits having pads P, P' having high hardness, the same techniques of detection and analysis of the probe mark normally used for electronic circuits with traditional pads, without substantially altering the properties of the electronic circuits (thanks to the use of the coating layer 140 that allows not exposing the pad P, P' to the external environment); in this way, it may be possible to optimally adjust the probing operation of the probe 130 on the pad P, P' so as to avoid waste, defects and/or breakage during the production of the electronic circuits. Moreover, an embodiment allows preventing the electric unreliability of the bonding operation of the electronic circuit 100 that might naturally occur due to the use of materials with high hardness (hard to solder) and the presence of the probe mark on such materials (that deform the surface on which the wirebond is welded).

Naturally, in order to satisfy local and specific requirements, a person skilled in the art may apply to an embodiment described above many logical and/or physical modifications and alterations. More specifically, although particular embodiments have been described with a certain degree of particularity, it should be understood that various omissions, substitutions and changes in the form and details as well as other embodiments are possible. In particular, different embodiments may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

In particular, the above-described embodiments are merely illustrative and in no way limitative. For example, an embodiment may be implemented with equivalent processes (by using similar steps, removing some steps being not essential, or adding further optional steps); moreover, the steps may be performed in different order, concurrently or in an interleaved way (at least partly). For example, the production process of the electronic circuit 100 may provide an additional phase including washing (through the use of high pressure water or by using plasma cleaning techniques) of the exposed surface of the conductive layer 115 before creating the conductive layer 140. The same step may be performed for the electronic circuit 100' before welding the wirebond 145 on the conductive layer 140.

The pad of the electronic circuit may include several and different layers of conductive material, depending on specific design demands or according to economic considerations. Moreover, each conductive layer of the pad may be formed in turn by a plurality of conductive layers. Furthermore, on the pad or on some intermediate conductive layers, a gold coating may be provided for improving electric properties thereof. In general, the conductive layers may be made, for example, of materials all equal to each other, depending on the desired hardness requirements: conductive materials that may be used in appropriate combination include (but not exclusively) palladium, nickel, gold, copper and aluminium.

Similar considerations are valid if the wire bond is replaced by a contact protruding protuberance (in jargon, bump) or by other types of electrical connections not explicitly mentioned but structurally and/or functionally equivalent.

Furthermore, an embodiment of the integrated circuit 100 or 100' may be coupled to one or more other integrated circuits or components to form a system, such as a computer system, cell phone, smart phone, system on a chip (multiple integrated circuits on a same die), or other electronic system. For example, the integrated circuit 100 or 100', or another integrated circuit of such a system, may be a processor or controller.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A method, comprising:
    forming an indentation in a contact pad disposed over a substrate by pressing a probe against the contact pad, the probe contacting a portion of the contact pad; and
    forming a layer of conductive material in the indentation, the conductive material contacting the portion of the contact pad.
2. The method of claim 1 wherein the forming the indentation comprises forming the indentation in at least one layer, but not all layers, of the contact pad.
3. The method of claim 1 wherein the forming the layer of conductive material comprises filing the indentation with the conductive material.
4. The method of claim 1, further comprising:
    determining whether a probe is aligned with the contact pad in response to the indentation.
5. The method of claim 1, further comprising:
    determining whether a probe card is aligned with an array of contact pads, the array of contact pads including the contact pad, the array of contact pads being disposed over the substrate.
6. A method, comprising:
    forming a plurality of conductive layers over a substrate having a plurality of electric circuit components, where said plurality of conductive layers provide an electric contact region with a hardness equal to or greater than 300 HV;
    contacting the electric contact region with a probe, said contacting forming a probe mark in a top surface of the electric contact region;
    conducting a test of the electric circuit components through the probe; and
    after said test is complete forming a coating conductive layer covering said electric contact region and filling said probe mark.
7. The method of claim 6, wherein the forming the plurality of conductive layers comprises forming a first layer, said first layer having a hardness equal to or greater than 300 HV.
8. The method of claim 7, wherein the forming the plurality of conductive layers further comprises forming a second layer on said first layer, said second layer comprised of a material protecting the first layer from contamination and corrosion.
9. The method of claim 8, wherein said probe mark is defined by a recess that extends from a top surface of the electric contact region through the second layer and at least partially into said first layer.
10. The method of claim 9, wherein the coating conductive layer fills said recess and further overlies the top surface of the electric contact region.
11. The method of claim 8, wherein the second layer is formed of gold or palladium.
12. The method of claim 11, wherein the first layer is formed of rhodium or cobalt.
13. The method of claim 6, wherein the coating conductive layer comprises palladium or gold or alloys thereof.
14. A method, comprising:
    forming a conductive layer over a substrate having a plurality of electric circuit components, where said conductive layer provides an electric contact region with a hardness equal to or greater than 300 HV;
    contacting the electric contact region with a probe, said contacting forming a probe mark in a top surface of the electric contact region;
    conducting a test of the electric circuit components through the probe; and
    after said test is complete forming a coating conductive layer covering said electric contact region and filling said probe mark.
15. The method of claim 14, wherein said probe mark is defined by a recess that extends from a top surface of the electric contact region, and wherein the conductive layer fills said recess and further overlies the top surface of the electric contact region.
16. The method of claim 14, wherein the electric contact region is formed of gold or palladium.
17. The method of claim 14, wherein the electric contact region is formed of rhodium or cobalt.
18. The method of claim 1, wherein the conductive material comprises palladium or gold or alloys thereof.
19. The method of claim 14, wherein the coating conductive layer is surrounded by a passivation layer.
20. The method of claim 19, wherein the coating conductive layer is coplanar with a top surface of the passivation layer.
21. A method, comprising:
    forming a conductive pad over a semiconductor substrate having a plurality of electric circuit components, the conductive pad comprising a first conductive layer and a second conductive layer disposed over the first conductive layer;
    contacting the conductive pad with a probe and thereby forming a cavity extending through the first conductive layer and an indentation in the second conductive layer that is aligned with the cavity;
    conducting a test of the electric circuit components through the probe; and after said test is complete forming a coating conductive layer covering said conductive pad and filling the cavity in the first conductive layer and the indentation in the second conductive layer, the coating conductive layer forming a planar surface above the second conductive layer.

22. The method of claim 21 wherein the coating conductive layer is configured to receive a wire bond or a solder ball.

23. The method of claim 21 wherein the coating conductive layer is palladium or gold or alloys thereof.

24. The method of claim 21 wherein the planar surface formed by the coating conductive layer is coplanar with a top surface of a passivation layer.

25. The method of claim 21 further comprising bonding a contact to the coating layer, the contact providing an electrical connection to the electric circuit components.

26. The method of claim 25 wherein the bonding the contact comprises welding a wire bond to the coating conductive layer.

* * * * *